(12) United States Patent
Hannam et al.

(10) Patent No.: US 8,847,576 B1
(45) Date of Patent: Sep. 30, 2014

(54) PHASE COMPENSATION METHOD AND APPARATUS FOR CURRENT TRANSFORMERS

(75) Inventors: Gerald Anthony Hannam, Loveland, CO (US); Nathaniel W. Crutcher, Westminster, CO (US)

(73) Assignee: Continental Control Systems, LLC, Boulder, CO (US)

( * ) Notice: Subject to any disclaimer, the term of this patent is extended or adjusted under 35 U.S.C. 154(b) by 259 days.

(21) Appl. No.: 13/599,895

(22) Filed: Aug. 30, 2012

(51) Int. Cl.
*G01R 15/18* (2006.01)

(52) U.S. Cl.
CPC .................................. *G01R 15/185* (2013.01)
USPC .......... 324/117 R; 324/76; 324/323; 324/330; 324/118

(58) Field of Classification Search
CPC ..... G01R 15/185; G01R 15/205; G01R 19/20
USPC ................ 324/117 R, 76, 323, 330, 118, 119
See application file for complete search history.

(56) References Cited

U.S. PATENT DOCUMENTS

| | | | | |
|---|---|---|---|---|
| 3,028,539 A | * | 4/1962 | Wright | 323/358 |
| 3,701,008 A | | 10/1972 | Kusters et al. | |
| 4,652,810 A | | 3/1987 | Hayashi | |
| 4,739,515 A | | 4/1988 | Herzog | |
| 4,879,626 A | | 11/1989 | Kim | |
| 5,231,347 A | | 7/1993 | Voisine et al. | |
| 5,729,145 A | * | 3/1998 | Blades | 324/536 |
| 6,617,839 B2 | * | 9/2003 | Kang et al. | 324/117 R |
| 6,784,728 B2 | * | 8/2004 | Fischer | 327/554 |
| 6,984,979 B1 | * | 1/2006 | Edel | 324/253 |
| 7,660,682 B2 | | 2/2010 | Slota et al. | |
| 8,054,593 B2 | * | 11/2011 | Reid et al. | 361/42 |
| 2003/0048648 A1 | * | 3/2003 | Lin et al. | 363/65 |
| 2009/0115403 A1 | * | 5/2009 | Bernklau | 324/127 |
| 2010/0219799 A1 | | 9/2010 | Minkner et al. | |
| 2011/0156698 A1 | | 6/2011 | Cook et al. | |

OTHER PUBLICATIONS

Knight, David, Analysis of Herzog's LF Phase Compensation Method for Current-transformers, G3YNH.info (website), 2007, pp. 1-7 Ottery St. Mary, Devon, UK, (http://www.g3ynh.info/zdocs/refs/Herzog/Analysis.html).

Knight, David, A6.2: The Maximally-Flat Current Transformer, G3YNH.info (website), 2005-2007, pp. 1-13, Ottery St. Mary, Devon UK, (http://www.g3ynh.info/zdocs/bridges/index.html).

Knight, David, A6.3: Amplitude response of conventional and maximally-flat current transformers, G3YNH.info (website), 2005-2007, pp. 1-13, Ottery St. Mary, Devon UK, (http://www.g3ynh.info/zdocs/bridges/index.html).

Hague, B., Instrument Transformers, Their Theory Characteristics and Testing, Sir Isaac Pitman & Sons, Ltd, 1936, pp. 39-55 and pp. 70-81, London.

* cited by examiner

*Primary Examiner* — Arleen M Vazquez
*Assistant Examiner* — Dominic Hawkins
(74) *Attorney, Agent, or Firm* — James R. Young; Cochran Freund & Young LLC

(57) ABSTRACT

A current transformer includes capacitive phase angle error correction in the secondary circuit boosted by an isolating impedance. Temperature compensation for the phase error correction and amplitude correction is also provided.

34 Claims, 3 Drawing Sheets

PHASE COMPENSATION METHOD AND APPARATUS FOR CURRENT TRANSFORMERS

BACKGROUND OF THE INVENTION

1. Field of the Invention

This invention is in the field of current transformers and, more particularly, phase angle error compensation for current transformers.

2. State of the Prior Art

Current transformers are common devices used for measuring alternating current (AC) flow in electric wires or bus bars. A typical current transformer comprises a magnetic core, a primary winding (which may be the high power wire or bus bar), and a secondary coil wound around one or more sectors or sections of the magnetic core. Essentially, a current transformer outputs a small current that is proportional to a larger current flowing in an electric wire or bus bar, and the use of a burden resistor on the output can provide a low voltage signal that is proportional to the current flowing in the high power electric wire or bus bar. Such small current or low voltage output signals from the current transformer can be used in a variety of instrumentation and control applications, including, for example, measuring and metering the amount of electric current flowing to a load or measuring the amount of power used by a load.

The output signal produced by a current transformer is ideally proportional to and in phase with the primary current. However, in actuality, all current transformers introduce errors which show up in the secondary output signals. Errors commonly specified for a current transformer are the ratio error and the phase error. Ratio in this context refers to the ratio of the primary current in the primary winding, e.g., high power wire or bus bar in which current is being measured, to the output current (or voltage) from the secondary winding. Ideally, the ratio of primary turns (commonly one turn) to secondary turns should define or scale the primary current in the primary winding down to the secondary (output) current. However, due to flux leakage, core losses, magnetizing current, and effects of the burden impedance, the secondary (output) current is less than ideal. For example, a current transformer with one primary turn and 100 secondary turns has a turns ratio of 1:100 and an ideal current ratio of 100:1. Therefore, such a current transformer would ideally output a 1 ampere current signal when the primary winding (e.g., high power wire or bus bar) is carrying 100 amperes of current, or it would ideally output a 5 ampere current signal when the primary winding is carrying 500 amperes of current. However, due to the factors discussed above, it is unlikely that the secondary (output) current signal will be exactly 1 ampere in the first example above or exactly 5 amperes in the second example. The difference between the ideal primary to secondary (output) current ratio and the actual primary to secondary (output) current ratio is the ratio error. Obviously, such ratio errors affect the accuracy of the current measurements made with current transformers, so efforts are usually made to keep such errors to a minimum and/or to compensate for them. It is common to use a ratio-correction factor defined as that factor by which the theoretical ratio of a current transformer must be multiplied to obtain the true ratio. Hence, if the ideal ratio is 100:1 as in the example above, while the actual ratio is 100:0.99, the ratio-correction factor would be 1.01, i.e. 100/0.99=1.01 (rounded). The ratio-correction factor can be applied to the current output measurement to correct the actual measurement to a corrected measurement.

These same parameters that cause the ratio error, e.g., magnetizing current and flux leakage, also cause a phase shift error to occur, which is sometimes called phase angle error or simply phase error. The phase angle error is the phase angle between the AC primary current and the secondary output signal. In a current transformer, a primary current produces a magnetic flux in the transformer core. A changing magnetic flux will induce a voltage across the secondary winding on the core. According to Faraday's Law, this induced voltage will equal the negative of the number of turns in the coil multiplied by the time rate of change of the magnetic flux. If the secondary coil is short-circuited or connected across a resistor, then the induced voltage will generate a current in the secondary coil. Lenz's Law states that the induced voltage generates a current, the magnetic field of which opposes the magnetic field induced by the primary current. However, some of the primary current goes to supplying the magnetic flux to generate the coil voltage (magnetizing flux), and some shows up as core losses due to eddy currents and hysteresis in the core. After the magnetizing flux and core losses are removed, this reduced primary current is the current that produces a magnetic flux in the core, which is opposed by the secondary current. Since the measured primary current does not include the inductive magnetization current, it will generally have a leading phase angle error compared to the actual primary current. Such phase angle error is not a significant factor for accuracy in current measurement, but it can be a substantial factor in power measurements. An uncompensated phase shift can lead to large errors in measurement of real power and power factor. These errors are typically higher in split-core current transformers than in solid core current transformers due to the air gaps in split cores, which reduce the core permeability, reducing the magnetizing inductance, increasing the magnetizing current, thereby increasing the phase angle error.

Accurate measurement and monitoring of electrical energy usage has been important in the past, but it is becoming even more important with expected continued increases in costs and prices of electrical energy. Errors in such measurements, when used as a basis for billing for electrical energy usage, can result in overcharging or undercharging energy users. Consequently, utility companies and other users of electric energy monitoring devices need monitoring devices with highly accurate current transformers that introduce minimal errors into overall monitoring system errors and preferably at minimal extra cost.

There are many methods used to reduce the ratio error and the phase angle error of current transformers. Methods to correct the ratio error can vary depending on the type of output. A current transformer providing a current output can be adjusted by modifying the primary to secondary turns ratio to achieve the desired output current for full scale primary current. A voltage output current transformer can be adjusted by changing the turns ratio and also by scaling the output burden resistor. Also, a ratio-correction factor as described above can be applied to the current output measurement to correct the actual measurement to a corrected measurement.

Phase angle errors in current transformers can be reduced by reducing the magnetizing current, for example, by making the magnetic core larger, by using more copper in the windings, by using higher permeability core materials, or by eliminating or reducing the size of gaps in the core. Of course, larger magnetic cores and more copper in the windings are more expensive and make current transformers physically larger, thus more difficult to fit into often cramped electrical panels. Higher permeability core materials can have much higher costs. Phase angle errors in current transformers can also be minimized or reduced to near zero by using phase compensation. There are many methods in common use for phase compensation in current transformers, including, for example, fairly simple passive phase correction methods using only resistive-capacitive-inductive components in some output circuit topologies, as well as more complex methods employing, for example, active phase compensation where added circuitry supplies the magnetizing current or inserts a phase correction.

Passive phase compensation methods generally add only minimal cost and complexity to current transformer output circuits and are usually preferred over active methods, if they can reduce phase errors sufficiently for the accuracy required for a particular application. One of the simplest passive phase compensation methods places a capacitor across the secondary output, as described by H. W. Price and C. Kent Duff, "Minimizing the errors of current transformers by means of shunts," *University of Toronto Eng. Res. Bull.*, No. 2, pp. 216-231 (1921) (Library of Congress TK2551, P7). See also, B. Hague, "Instrument Transformers: Their Theory, Characteristics and Testing: A Theoretical and Practical Handbook for Test-Rooms and Research Laboratories," Chapter III, pp. 78-81, Pitman Publishing Corp., New York (1936). Since the current transformer magnetizing current is inductive, adding capacitive correction can cancel the effect of the inductive magnetizing current as measured at the output.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting. In the drawings.

DETAILED DESCRIPTION

Figure 1:
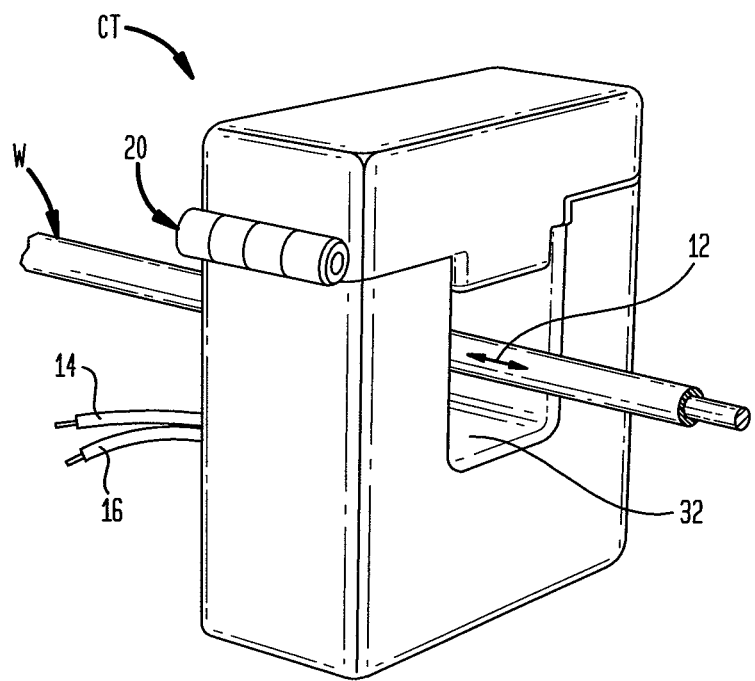
FIG. 1 is a diagrammatic isometric view of an example split-core current transformer with a secondary output circuit that can be implemented with a resistor-boosted capacitance phase correction subcircuit as described herein.
Figure 2:
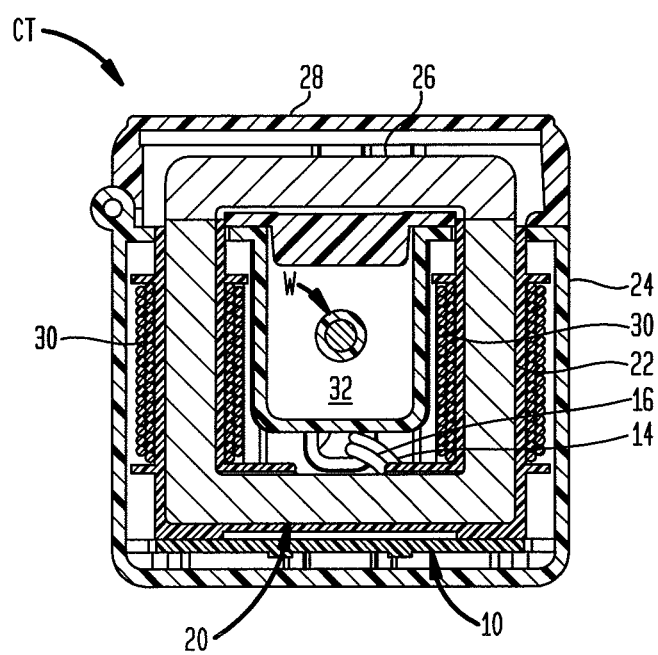
FIG. 2 is a diagrammatic cross-section elevation view of the example spit-core current transformer of FIG. 1.
Figure 3:
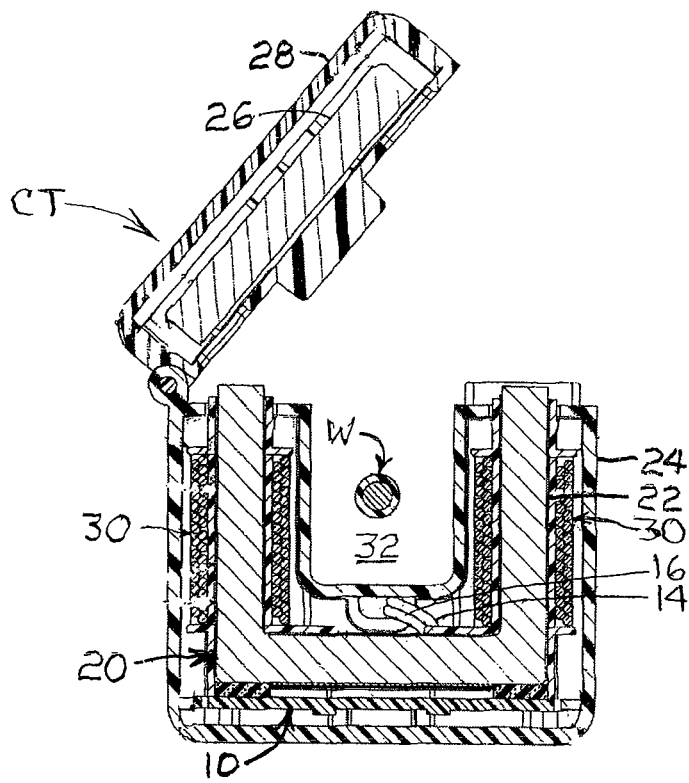
FIG. 3 is a diagrammatic cross-section view of the example split-core current transformer similar to FIG. 2, but illustrating the open configuration for placement of the current transformer around a primary winding in the form of an electric wire or bus bar.

An example split-core current transformer CT is shown in FIGS. 1-3 with a secondary output circuit 10 that is implemented with a resistor-boosted, capacitive phase correction output circuit, as will be described in more detail below, to illustrate an example application of this invention. In FIGS. 1-3, the example current transformer CT is illustrated surrounding a high power conductor W in a typical position for detecting and measuring the magnitude of AC current (indicated schematically by the arrow 12) flowing in a conductor W, which is illustrated for example as an electric wire, but it is representative of any conductor, including a wire, cable, bus bar, or any other electrical conductor that carries an AC current to be measured or monitored by the current transformer CT. Essentially, the example current transformer CT is structured and wired to output a measurement signal on output conductors 14, 16 that is indicative of the electrical current flowing in the conductor W.

While the phase correction capability described herein is applicable to any current transformer apparatus, including solid-core current transformers (not shown), it is particularly beneficial and applicable to split-core current transformers, which typically suffer from larger phase angle errors between the primary current and the secondary current than solid-core current transformers. Because of such larger phase angle error characteristics of split-core current transformers, the phase correction circuit 400 is particularly beneficial for split-core current transformers and enables them to be used in more applications, including revenue metering by power utility companies and other applications in which very good accuracy is required. In general, if the phase angle error between the primary current (e.g., current in the primary winding, such as the conductor W in FIGS. 1-3) and the output current of a current transformer output circuit is greater than 0.2 degrees, then significant measurement errors are propagated from the current transformer output into the electric energy measurements in energy metering and monitoring systems that utilize such current transformer output signals. While many solid-core current transformers have phase angle errors between the primary current and the secondary current that do not exceed 0.2 degrees, split-core current transformers typically have phase angle errors between the primary current and the secondary current in the range of five to ten times greater than 0.2 degrees. Therefore, the example current transformer CT is shown in FIGS. 1-3 as a split-core type current transformer, but with the understanding that the example phase corrected output circuit 10 described herein is not limited to split-core current transformers and can be used with solid-core current transformers and similar devices if desired.

While solid-core current transformers generally have less phase angle error than split-core current transformers, as explained above, split-core current transformers have a number of other advantages, which make them more convenient and more desirable for many uses than solid-core current transformers. In the example split-core current transformer CT shown in FIGS. 1-3, the magnetic core 20 is split so that a first part 22 of the magnetic core 20 is positioned in a base module 24 and a second part 26 of the magnetic core positioned in a cover module 28. The secondary windings 30 in the example CT in FIGS. 1-3 are positioned around portions of the first part 22 of magnetic core 20 so that the cover module 28 containing the second part 26 of the core 20 can be opened from the base module 24, as illustrated in FIG. 3, without disturbing the windings 30 in the base module 24.

When the cover module 28 is opened from the base module 24, as illustrated in FIG. 3, the current transformer CT can be positioned around the primary conductor W, so that, when the cover module 28 is closed again (FIGS. 1 and 2), the primary conductor W is positioned in the aperture 32 of the current transformer CT surrounded by the base module 24 and the cover module 28 as well as by the magnetic core 20. Consequently, a split-core current transformer, such as the example split-core current transformer CT in FIGS. 1-3, can be opened for placement around a primary conductor W and then closed for use without temporarily disconnecting the conductor W from its source or circuit.

In contrast, to install a current transformer that has a solid core (not shown) onto a conductor W, the conductor W has to be inserted through the center hole or aperture of the solid core, which may require disconnecting the conductor W from its circuit, inserting it through the solid core, and then reconnecting the conductor W to its circuit. In many installations, the conductor W is a large sized, high power wire or bus bar that is stiff or inflexible, thus difficult and potentially dangerous to handle, so such maneuvers for mounting a solid-core current transformer around a primary wire, bus bar, or other primary conductor are not nearly as convenient and safe as mounting a split-core current transformer.

Figure 4:
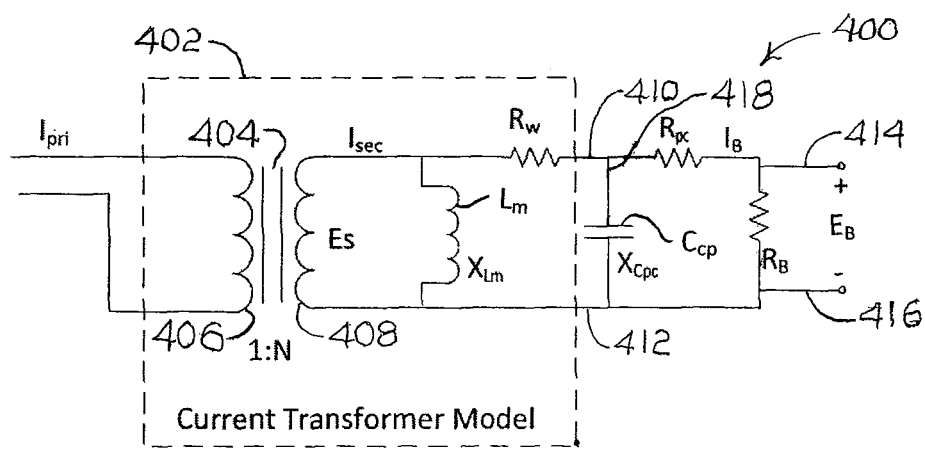
FIG. 4 is a schematic diagram of a simplified equivalent circuit model of a current transformer and output circuit implemented with an example resistor-boosted phase correction subcircuit.

The example phase error correcting circuit 400 illustrated in FIG. 4 is a convenient and inexpensive, yet effective, stable, and reliable, way of correcting the phase angle error of current transformers, including split-core current transformers, to less than 0.2 degrees—even near zero degrees—over operating voltage and temperature ranges needed for typical electric energy metering and monitoring applications in the AC frequency realm of 60 Hz and 50 Hz electric power that is typically supplied by public utility companies in the United States, Europe, and other countries, although it is also applicable with greater or lesser effectiveness, convenience, or expense in other frequencies as will be understood by persons skilled in the art once they understand the principles of the phase error correcting circuit 400. Further, this phase error correcting circuit 400 provides secondary output signals with less than 0.2 degrees phase angle error without having to resort to larger cross-sectional area of the core, larger number of secondary winding turns, larger gauge wire for the secondary windings, and other techniques that also increase the physical size of the current transformers. Therefore, the example phase error correcting circuit 400 could be used for, or as a part of, the phase corrected output circuit 10 of the example split-core current transformer CT described above, as well as in myriad other split-core and solid-core current transformer output circuits, to provide secondary output signals with very small phase angle error, e.g., less than 0.2 degrees, even for split-core current transformers with small physical sizes that can be used conveniently in crowded electrical panels and other tight spaces.

By realizing which impedances in a current transformer model are significant and which ones can be ignored due to their small, insignificant effects, the electrical characteristics of a current transformer can be modeled schematically as shown by the current transformer model 402 in the schematic diagram of the example phase error correcting secondary output circuit 400 in FIG. 4. The current transformer model circuit 402 in FIG. 4 includes a core 404 (which could be the split-core 20 in the current transformer CT described above), a primary winding 406 (which could be the conductor W described above), and a secondary winding 408 (which could be the secondary winding 30 described above). The turns ratio of primary windings to secondary windings in the example current transformer model circuit 402 is indicated to be 1:N, where N is the number of secondary winding turns on the core 404, which would provide a theoretical input to output current ratio of N:1. $I_{pri}$ is the current in the primary winding 406, and $I_{sec}$ is the current in the secondary winding 408. $E_s$ symbolizes the voltage across the secondary winding 408. $R_w$ symbolizes the inherent resistance of the wire conductor that forms the secondary winding 408. $L_m$ symbolizes the current transformer inductance that is induced by the current flow in the secondary winding 408, and $X_{Lm}$ symbolizes the secondary inductive impedance in the secondary winding 408 that results from the impedance $L_m$. The secondary inductive impedance $X_{Lm}$ is a function of both the current transformer inductance $L_m$ and the frequency f of the alternating current (AC) according to the relationship $X_{Lm}=2\pi f L_m$. As an aside explanation, impedance, conventionally indicated with the symbol Z, has real and imaginary components. The real component is referred to as resistance R, and the imaginary component is referred to as reactance X. Reactance X can be capacitive reactance $X_C$ and/or inductive reactance $X_L$. Persons skilled in the art will recognize that $L_m$ and $X_{Lm}$ as shown in the drawing and used in this description are inherent characteristics of the current transformer that are represented in the model 402 as equivalent physical components, and there is a real resistive characteristic of the core inductance $L_m$ which can be modeled as a resistance (not shown) in parallel with the core inductance $L_m$. This core resistance characteristic, if modeled, would also be in parallel with the combination of the resistances from $R_w$, $R_{pc}$, and $R_B$. However, since the combination of resistances $R_w$, $R_{pc}$, and $R_B$ is typically orders of magnitude smaller than the core resistive loss component, the core resistance component was not shown in the simplified equivalent current transformer circuit 400 in FIG. 4. The slight error that results due to that core resistive loss can be calibrated out by a slightly larger burden resistance $R_B$. Consequently, the inductive impedance associated with the inductance $L_m$ is modeled as purely reactive and is symbolized in FIG. 4 by the inductive reactance symbol $X_{Lm}$. Persons skilled in the art will also understand that, while the inherent resistance of the secondary winding $R_w$ is real, it can be represented in the model circuit 402 as a discrete resistive component $R_w$, although it is not actually a discrete resistor in the circuit.

As is typical in conventional current transformers in which a voltage output signal is desired, a burden resistance $R_B$ is placed across the secondary winding 408, resulting in the output signal voltage $E_B$, which is indicative of the magnitude and phase of the secondary current $I_{sec}$, which is indicative of the magnitude and phase of the primary current $I_{pri}$ (as compromised by any uncorrected ratio and phase angle errors). Therefore, the output signal voltage $E_B$ can be used as an input to electric energy measuring, metering, or monitoring circuit components, devices, or systems. The burden resistance $R_B$ can be located inside the current transformer (thus sometimes called internal burden), or it could be located at the measuring, metering, or monitoring instrument or device (thus sometimes called external burden). The burden resistance $R_B$ could also be a combination of internal and external burdens.

Capacitive phase compensation is used in the example phase error correcting circuit 400 illustrated in FIG. 4 to correct the phase angle error to less than 0.2 degrees and even to near zero degrees, but with a somewhat counter-intuitive enhancement with a boost resistance $R_{pc}$ that significantly decreases the capacitance value, thus also significantly decreasing the physical size and expense required for capacitive phase compensation to correct phase angle error to less than 0.2 degrees, even to near zero degrees. The capacitive phase compensation is provided in the example phase error correcting circuit 400 by the capacitor $C_{pc}$ positioned in parallel with the burden resistance $R_B$ to produce capacitive shunt impedance $X_{Cpc}$ across the burden resistance $R_B$, and the boost is provided by the resistor $R_{pc}$ as described in more detail below. The addition of the boost resistance $R_{pc}$ effectively increases the voltage across the capacitor $C_{pc}$ without significantly changing the output signal voltage $E_B$. Increasing the voltage across the capacitor $C_{pc}$ in this manner causes more current flow through the capacitor $C_{pc}$ branch 418 of the circuit 400, thus resulting in slightly less current flow through the burden resistor $R_B$. Therefore, it may be necessary to adjust the burden resistance $R_B$ value to compensate the ratio.

For only the current transformer model 402 portion of the example output circuit 400, the phase angle error is leading. In other words, if only the burden resistance $R_B$ was applied to the output leads 410, 412 of the current transformer model 402 for a measurable output voltage $E_B$ (e.g., no capacitor $C_{pc}$ and no resistance $R_{pc}$ in the circuit), the output voltage $E_B$ would lead the primary current $I_{pri}$. The phase angle error $\phi$ can be calculated by the following equation:

$$\Phi = \tan^{-1} \frac{R_w + R_B}{\omega L_m} \quad \text{(Equation 1)}$$

where:

$\phi$ is the phase angle error of secondary current relative to primary current;

$R_B$ is the burden resistance added across secondary winding (ohms);

$R_w$ is the resistance of the current transformer secondary winding (ohms);

$\omega$ is the radian frequency (radians/s); and $L_m$ is the inductance of current transformer (H) (note: $X_{Lm} = \omega L_m$).

Since the phase angle error is leading, it is intuitive to compensate for the leading phase angle error by adding the shunt capacitor $C_{pc}$ across the burden resistance $R_B$ as taught by Hague, supra, and explained above. The addition of the capacitive shunt impedance $X_{Cpc}$ across the burden resistance $R_B$ compensates for the leading phase angle error. The capacitance $C_{pc}$ required to reduce the net phase angle error in the model circuit 402 in FIG. 4 to zero or near zero degrees without any boost resistance $R_{pc}$ can be determined by Equation 6 below, which can be derived as follows:

The secondary voltage $E_s$ is:

$$E_s = I_{sec} * \frac{j\omega L_m * \left(R_w + \frac{R_B}{1 + j\omega C_{pc} R_B}\right)}{j\omega L_m + R_w + \frac{R_B}{1 + j\omega C_{pc} R_B}} \quad \text{(Equation 2)}$$

The output voltage is:

$$E_B = \frac{E_s * \frac{R_B}{1 + j\omega C_{pc} R_B}}{R_w + \frac{R_B}{1 + j\omega C_{pc} R_B}} \quad \text{(Equation 3)}$$

To get the phase relationship between $I_{sec}$ and output voltage $E_B$, Equation 2 can be substituted into Equation 3:

$$E_B = I_{sec} \frac{j\omega L_m R_B}{R_B + (j\omega L_m + R_w)(1 + j\omega C_{pc} R_B)} = \quad \text{(Equation 4)}$$

-continued $$\frac{I_{sec}}{\frac{1}{j\omega L_m} + \frac{1}{R_B} + \frac{R_w}{j\omega L_m R_B} + j\omega C_{pc} + \frac{C_{pc} R_w}{L_m}}$$

For the phase shift between $E_B$ and $I_{sec}$ to be zero degrees, the reactive impedance of the denominator must equal zero:

$$\frac{1}{j\omega L_m} + \frac{R_w}{j\omega L_m R_B} + j\omega C_{pc} = 0 \quad \text{(Equation 5)}$$

The value of the capacitor $C_{pc}$ required can be determined by solving Equation 5 for $C_{pc}$:

$$C_{pc} = \frac{\frac{R_w}{R_B} + 1}{\omega^2 L_m} \quad \text{(Equation 6)}$$

The value of the inherent winding resistance $R_w$ is a fixed value for a given gauge, composition, and length of the wire that is used for the secondary winding and can be determined by routine measurement or by calculations, as would be understood by persons having ordinary skill in the art. The value of the burden resistance $R_B$ is a set value for whatever burden resistance is used in a particular current transformer, which is determined based on the turns ratio and desired output voltage $E_B$, e.g., for full scale current measurements with a particular current measurement circuit or device. Large capacitance values may be needed especially to correct larger phase angle errors and for small values of $R_B$. A low value for $R_B$ results in a very low value for $E_B$. Since $E_B$ is also the voltage across $X_{Cpc}$, a low $E_B$ results in minimal current flow through $X_{Cpc}$, thus provides minimal correction of the phase angle error. Consequently, achieving a desired phase angle error correction with a capacitive shunt $C_{PC}$ across the burden resistance $R_B$, as taught by Hague, supra, i.e., without the boost resistance $R_{pc}$ described below and shown in FIG. 4, may require a very large capacitance value for $C_{pc}$ when a low burden resistance $R_B$ or no burden resistance is used.

However, for split-core current transformers, especially small, compact sized split-core current transformers, merely adding the shunt capacitor $C_{pc}$ across the burden resistance $R_B$, as taught by Hague, supra, and explained above, is not, by itself (i.e., without the resistance $R_{pc}$ in FIG. 4), an optimal or even a viable solution for phase compensation, at least not with capacitor components that are commercially available in the current market. As explained above, split-core current transformers are made with magnetic cores that are split, so that they can be opened or disassembled for mounting around high-power wires, bus bars, or other conductors for which current is to be measured, metered, or monitored. However, magnetic cores that are split have unavoidable air gaps that increase magnetic reluctance, which in turn decreases the permeability of the core and causes higher flux leakage and excitation current, all of which increases the secondary coil output errors, particularly the phase angle error, as explained above. Consequently, merely adding the shunt capacitor $C_{pc}$ across the burden resistance $R_B$, as taught by Hague, supra, and explained above, but without the resistance $R_{pc}$ in FIG. 4, would require capacitors $C_{pc}$ with large capacitance values in order to provide even somewhat adequate phase correction in split-core current transformers, let alone to reduce phase angle error in the secondary output circuit (e.g., at $E_B$ in FIG. 4) to near zero or less than 0.2 degrees.

As also explained above, a smaller burden resistance $R_B$ also increases the capacitance value of the $C_{pc}$ needed for phase compensation, which further exacerbates the problem of providing enough capacitance at $C_{pc}$ in FIG. 4 to provide sufficient phase compensation for small split-core current transformers. The burden resistance $R_B$ required for a particular current transformer is determined by the output voltage $E_B$ that is required for full current scale measurements or for particular desired output voltage $E_B$ values for particular current values and by the number of turns in the secondary winding 408. In typical applications of current transformers, both those that require voltage output and those that require current output, it is common to use a low resistance for the burden resistance $R_B$, because low burden resistance results in better current transformer performance. Some current output current transformers are even used with a shorted secondary, resulting in burden resistance $R_B$ of near zero ohms comprising only the resistance of the lead wires. Such low or nearly zero burden resistance $R_B$ value results in a very low value for the output voltage $E_B$. If such low output voltage $E_B$ should be the same voltage that appears across the capacitive phase correction impedance $X_{C_{pc}}$, as is the case of capacitance phase compensation with only the shunt capacitor $C_{pc}$ as taught by Hague, supra, (i.e., without the resistance $R_{pc}$ in FIG. 4), there would be minimal current flow through the shunt capacitance impedance $X_{C_{pc}}$, thus only minimal phase compensation for phase angle correction. Of course, providing a much larger shunt capacitance $C_{pc}$ value, e.g., greater than five microfarads, would result in more current flow through the shunt capacitive impedance $X_{C_{pc}}$, thereby increasing the effective phase compensation provided by the shunt capacitive impedance $X_{C_{pc}}$ in many current transformer applications, but that solution is limited by the lack of high quality capacitors available with capacitance values greater than five microfarads. Use of many higher quality, smaller capacitance value capacitors connected in parallel to each other could be used to reach such higher effective capacitance values needed for effective phase compensation, but that solution in and of itself would be counterproductive to the requirements and desired attributes for small-sized split-core current transformers as explained above because many smaller capacitance value capacitors connected together in the circuit would require a lot of physical space, thus requiring increased size of the current transformer. Consequently, the inherently large phase angle errors in split-core current transformers due to the split magnetic core, as explained above, in combination with the minimal current flow through the capacitive impedance $X_{C_{pc}}$ due to the low or near zero burden resistance often used with small, low output voltage or current output applications, as also explained above, would require excessively large and generally impractical capacitance $C_{pc}$, e.g., greater than five microfarads, to even approach the desired or required phase compensation to correct phase angle errors to less than 0.2 degrees, let alone to less than 0.1 or even lower to near zero degrees. For common electric power measurement current transformers, especially split-core designs, the capacitance $C_{pc}$ required to provide that kind of phase compensation, if possible at all, would dictate the use of physically large, or poor quality capacitors. At values greater than one or two microfarads, the voltage coefficient and temperature coefficient of commercially available ceramic capacitors limit the usefulness of capacitance phase compensation for phase angle error correction as taught by Hague, supra.

For example, it was observed when using X7R ceramic capacitors, which are typical high quality, high capacitance value capacitors available commercially (e.g., 100 picofarads to 22 microfarads), that capacitance values varied greatly with the applied voltage. Upon looking at a typical vendor datasheet for a X7R ceramic capacitor, it was realized that the capacitance can be expected to change 30% over the range from 0 to 0.5 VAC, which is not satisfactory for accurate current transformer applications. On the other hand, C0G/NP0 capacitor datasheets for higher quality C0G/NP0 capacitors indicate there is minimal change in capacitance with voltage and temperature, negligible capacitance drift and hysteresis, and almost no changes in capacitance over time. C0G is a capacitor dielectric designation defined by the Electronics Industry Alliance (EIA), which has a flat temperature coefficient over temperature, and it is also called NP0 (negative-positive-zero), which refers to its value change over temperature. C0G (NP0) ceramics offer one of the most stable capacitor dielectrics available. However, such higher quality C0G (NP0) capacitors are not available in capacitance values large enough to provide sufficient phase compensation for current transformers with the Hague, supra, method described above to correct the phase angle error in split-core current transformers with small burden or no burden resistors. Typical C0G (NP0) ceramic capacitors are available in a range of one picofarad to just over 100 nanofarads. While it may be possible to add many of such higher quality capacitors in parallel to provide enough capacitance shunt current through the capacitive impedance $X_{C_{pc}}$ to approach and possibly even attain adequate phase compensation in small, low output, split-core current transformers with the Hague, supra, method, the use of such large numbers of capacitors in the output circuit would cause the physical size and cost of the current transformers to increase significantly.

To solve this problem left by the Hague, supra, method, the phase error correcting secondary output circuit 400 in FIG. 4 includes the boost resistor (or complex impedance) $R_{pc}$ in series with the burden resistor $R_B$ to effectively isolate or partially isolate the capacitive impedance $X_{C_{pc}}$ from the burden resistance $R_B$ across which the output voltage $E_B$ is measured in a manner that boosts the current flow through the capacitive shunt impedance $X_{C_{pc}}$ without increasing the burden resistance $R_B$ or the output voltage $E_B$ that is measured across the burden resistance $R_B$. Such boosted current flow through the capacitive shunt impedance $X_{C_{pc}}$ enables the use of smaller valued shunt capacitance $C_{pc}$ and still attain the desired small physical size and capacitor performance over normal voltage and temperature operating ranges with sufficient phase compensation to provide even relatively small-sized, split-core current transformers with phase angle error correction to less than 0.2 degrees, even to near zero degrees. In one model, the addition of the boost resistance $R_{pc}$ decreased the capacitance value required for such phase compensation by a factor of ten. Adding the boost resistance $R_{pc}$ causes more current to flow through the capacitor $C_{pc}$, thus less current flow through the burden resistor $R_B$. However, to maintain the correct output signal voltage $E_B$ for accurate current measurement purposes, the burden resistance $R_B$ can be increased and/or the turns ratio can be increased, as will be understood by persons skilled in the art once they understand the principles of this invention. While the additional isolating impedance between the burden resistor $R_B$ and the parallel capacitive shunt branch containing the capacitive impedance $X_{C_{pc}}$ in FIG. 4 is shown, for example, as the resistor $R_{pc}$ in series with the burden resistor $R_B$, such isolating impedance to increase the proportion of the secondary current $I_{sec}$ flow through the shunt capacitive impedance $X_{C_{pc}}$ and decrease, but not eliminate, the proportion of the secondary current $I_{sec}$ flow through the burden resistance $R_B$ could be provided by any other network of components that provides that isolating impedance function.

Addition of the boost resistance $R_{pc}$ to the capacitive phase error correcting circuit 400 in FIG. 4 is counter-intuitive for a number of reasons. For example, the addition of the boost resistance $R_{pc}$ would seem, at first glance, to have at least the following effects that tend to increase, not decrease, phase angle error: (i) The added resistance $R_{pc}$ causes the uncompensated phase angle error of the current transformer (e.g., the phase angle error of current transformer model 402 in FIG. 4) to increase, not decrease, as explained in more detail below; (ii) The added resistance $R_{pc}$ increases the current transformer secondary voltage, which reduces the available margin before core saturation, and core saturation reduces the inductance of the transformer, which increases phase angle and ratio errors; and (iii) The additional resistor $R_{pc}$ adds complexity and increases power consumption to the output circuit 400 for no apparent reason, at least until an understanding of this invention is attained. However, countering and more than overcoming those apparent negative effects, the boost resistance $R_{pc}$ also isolates the capacitive impedance $X_{Cpc}$ from the burden resistance $R_B$, which allows a much larger voltage across the capacitor $C_{pc}$ in spite of a low or near zero burden resistance $R_B$, so that a proportionally larger current will flow through the capacitive resistance $X_{Cpc}$. Such larger current flow through the capacitive resistance $X_{Cpc}$ achieves a greater capacitive phase compensation to more than offset those negative effects of the boost resistance $R_{pc}$ and to reduce, and even eliminate, the leading phase angle error of the current transformer. It may be noted that adding or increasing the boost resistance $R_{pc}$ also increases the capacitive and inductive currents, since it raises the voltage $E_s$ across the secondary winding 408. However, the effect of the added or increased boost resistance $R_{pc}$ is greatest across the capacitor $C_{pc}$, i.e., in the capacitive impedance $X_{Cpc}$, since this voltage in $X_{Cpc}$ would otherwise be very low or near zero without the resistor $R_{pc}$, thus not much of a factor for phase compensation. As a consequence, while adding or increasing the boost resistance $R_{pc}$, thus increasing the inductive current that causes phase angle error in the current transformer would seem, at first look, to be counterproductive to the goal of decreasing phase angle error, the capacitive phase compensating effect of adding or increasing the boost resistance $R_{pc}$, thus capacitive impedance $X_{Cpc}$, is so much greater than the phase error producing effect of the greater inductive current flow in secondary winding that it more than offsets the increased inductive phase angle error.

The added or increased boost resistor $R_{pc}$ increases the uncompensated phase angle error φ in the current transformer model 402 portion of FIG. 4 due to the increase in the numerator value of Equation 1 that results from adding $R_{pc}$ to the $R_w + R_B$ values in the numerator of Equation 1 as follows:

$$\Phi = \tan^{-1} \frac{R_w + R_B + R_{pc}}{\omega L_m} \quad \text{(Equation 7)}$$

The relationship between $C_{pc}$ and $R_{pc}$ to achieve a zero phase angle error can be found from Equation 6, but where $R_{pc}$ is now added to $R_B$ in the equation:

$$C_{pc} = \left(\frac{R_w}{R_B + R_{pc}} + 1\right) / \omega^2 L_m \quad \text{(Equation 8)}$$

Solving for $R_{pc}$ yields:

$$R_{pc} = \frac{R_w}{\omega^2 L_m C_{pc} - 1} - R_B \quad \text{(Equation 9)}$$

where:
$R_{pc}$ is the phase compensation (boost) resistance (ohms);
$R_B$ is the burden resistance specified for the particular current transformer (ohms);
$R_w$ is the inherent resistance of the current transformer secondary winding (ohms);
$L_m$ is the inductance of current transformer (H);
$C_{pc}$ is the capacitance of the shunt capacitor(s) added for the phase compensation (F); and
ω is the radian frequency of the AC current in the secondary winding (radians/s).
Other phase angle errors besides zero can also be determined by solving Equation 4.

As explained above, the addition of the capacitive boost resistor $R_{pc}$ enables smaller capacitance values $C_{pc}$ shunted across the burden resistance $R_B$ to correct the phase angle error than the capacitance values that would be required without the boost resistor $R_{pc}$. However, too much boost resistance at $R_{pc}$ would cause saturation of the magnetic core 404, which would cause the output voltage $E_B$ to become insensitive to, or not linearly indicative of, the primary current $I_{pri}$ in the primary conductor, thereby rendering the output essentially useless as a measurement or indication of the primary current $I_{pri}$. Therefore, the maximum useful value of $R_{pc}$ is limited by the margin to saturation limit. The saturation limit for any particular current transformer depends on the core material of the transformer. Saturation limits for different core materials are commonly available on core material datasheets. The secondary voltage limit of a core for the saturation level of magnetic flux can be determined from the universal EMF equation. If the flux in the core is sinusoidal, the following equation can be used to determine the maximum voltage of the secondary winding:

$$E = 2\pi f N A_c B \quad \text{(Equation 10)}$$

where E is peak the voltage of the secondary winding, f is the frequency in hertz, N is the number of secondary turns, $A_c$ is the cross-sectional area of the core in square meters, and B is the peak magnetic flux density in tesla. Based on the core material, a value for B is chosen below the saturation level and then E can be calculated from Equation 10. This value of E, converted from a peak voltage to an equivalent RMS voltage by dividing by the square root of two, can be the upper limit for $E_s$ in Equation 2. The value of $R_{pc}$ is added to the value of $R_B$ in Equation 2 to become:

$$E_s = I_{sec} * \frac{j\omega L_m * \left(R_w + \frac{R_B + R_{pc}}{1 + j\omega C_{pc}(R_B + R_{pc})}\right)}{j\omega L_m + R_w + \frac{R_B + R_{pc}}{1 + j\omega C_{pc}(R_B + R_{pc})}} \quad \text{(Equation 11)}$$

The value of $R_{pc}$ that increases Es in Equation 11 above the E determined from Equation 10 is the upper limit of $R_{pc}$.

As explained above, selections of good quality capacitors on the market, e.g., C0G (NP0) capacitors, are generally available only in lower capacitance values. Therefore, if the overall physical size of the current transformer is a concern with a desire to keep it small, while also correcting a phase angle error of a typical of split-core current transformers (e.g., 0.3 degrees to 5.0 degrees) to be not more than 0.2 degrees (preferably less than 0.1 degrees or, even better, at or near zero degrees), then commercially available, good quality capacitors, may limit the choice for the shunt capacitor $C_{pc}$ to one that has a capacitance value of five (5) µF (microfarad) or less, and more likely to not more than 0.5 µF. Of course, the capacitance value $C_{pc}$ has to be greater than zero. Therefore, in general, a capacitance $C_{pc}$ value of $0\,\mu F < C_{pc} \leq 5\,\mu F$ can be used with a boost resistance $R_{pc}$ to correct a phase angle error of a split-core current transformer to 0.2 degrees or less, and, with appropriate selection of capacitance $C_{pc}$ and boost resistance $R_{pc}$ values, a capacitance $C_{pc}$ value of $0\,\mu F < C_{pc} \leq 0.5\,\mu F$ can be used with a boost resistance $R_{pc}$ to correct a phase angle error of a split-core current transformer to 0.2 degrees or less. This capacitance range facilitates selection and use of a high quality C0G (NP0) capacitor for the capacitance $C_{pc}$. Once the shunt capacitor $C_{pc}$ is selected, the capacitance value can be used in Equation 9 to determine the required resistance value for the isolation (boost) resistor $R_{pc}$, and the $R_{pc}$ can be checked in Equation 11 to be sure it does not cause Es to exceed the E in Equation 10, i.e., does not cause saturation of the magnetic core 404.

Another benefit of using the boost resistor $R_{pc}$ is that the phase can be adjusted to a finer level since resistors are available commercially in finer increments between values than is available with capacitors. As also mentioned above, some current transformers have very small or even no burden resistance. The use of a boost resistor $R_{pc}$ also makes it easier to provide phase compensation, i.e., phase angle error correction, in current transformers where very small or even no burden resistance is used. In any event, the boost resistance $R_{pc}$ does not have to be, and is unlikely to be, equal to the burden resistance $R_B$ because $R_{pc}$ and $R_B$ are each selected based on respective different design constraints and purposes. The burden resistance $R_B$ is determined by the turns ratio and the desired output voltage $E_B$, whereas the boost resistance $R_{pc}$ is determined by core saturation and optimizing to a low shunt capacitor $C_{pc}$ value for reducing or eliminating the phase angle error as explained above. For typical current transformers in which the burden resistance $R_B$ is less than ten (10) ohms and that have uncompensated and uncorrected phase angle error of more than 0.3 degrees, the boost resistance $R_{pc}$ will be greater than the burden resistance $R_B$. Essentially, the boost resistance $R_{pc}$ is positioned in series with the signal output, which comprises opposite polarity outlet leads 414, 416, for the purpose of using smaller, high quality capacitors $C_{pc}$ in parallel with the output 414, 416 for phase error compensation and correction, as explained above. There is no need for, or use of, any additional inductance in the secondary circuit, other than the inductance $L_m$ that is induced by the current flow in the secondary winding as explained above. In essence, the shunt capacitor $C_{pc}$ provides phase compensation across the secondary winding that counterbalances the inductive phase angle error, and the boost resistor $R_{pc}$ is added in series with the burden resistor $R_B$, which is in parallel to the shunt capacitor $C_{pc}$, in order to get the required phase angle correction, i.e., to reduce phase angle error to 0.2 degrees or less, with less capacitance so that a small, high quality capacitor can be used for the shunt capacitor $C_{pc}$. The ability to use a physically small sized, small capacitance value, high quality capacitor for the shunt capacitor $C_{pc}$ enables significant phase angle error correction, e.g., reducing phase angle error as explained above down to 0.2 degrees or less, with minimal drift due to normal temperature variations, minimal lifetime drift, and minimal drift over typical operating voltage $E_B$ ranges.

As can be seen in Equation 7, the phase angle correction provided by the shunt capacitor $C_{pc}$ in FIG. 4 is dependent on frequency f. At high frequencies, over correction in the phase angle error correction occurs, and negligible phase angle error correction is provided at lower frequencies. Therefore, the phase angle correction is sensitive to frequency, and the particular capacitance value for the shunt capacitor $C_{pc}$ and the resistance or impedance value of the boost resistor $R_{pc}$ have to be selected to provide the phase angle correction desired for a particular operating frequency, for example, 60 Hz or 50 Hz, without saturating the core 404, as explained above. However, for that particular frequency, the combination shunt capacitor $C_{pc}$ and boost resistor $R_{pc}$ as shown in FIG. 4 and explained above provide precise and effective phase angle error correction with minimal variance or drift from temperature variations encountered in typical current transformer applications and environments.

Example I

A current transformer was built and tested at various primary full scale current options. The phase angle error φ and capacitor $C_{pc}$ values required for phase angle error correction to zero degrees are shown in the following Table 1:

TABLE 1

| CT Full Scale Current, Amps | Burden Resistor, $R_B$, ohms | Phase Error, Degrees | Initial Phase Capacitance ($C_{pc}$) required to correct phase error to zero degrees, microfarads | Added Phase Compensation Resistor, $R_{pc}$, ohms | Phase Capacitance ($C_{pc}$) required to correct phase error after adding $R_{pc}$, microfarads |
|---|---|---|---|---|---|
| 20 | 66.7 | 0.80 | 0.56 | 21 | 0.50 |
| 30 | 44.4 | 0.72 | 0.75 | 42.3 | 0.50 |
| 50 | 26.7 | 0.66 | 1.15 | 56 | 0.50 |
| 75 | 17.8 | 0.63 | 1.65 | 56 | 0.50 |
| 100 | 13.3 | 0.61 | 2.15 | 56 | 0.50 |
| 150 | 8.89 | 0.60 | 3.00 | 60.4 | 0.50 |
| 200 | 6.67 | 0.59 | 4.00 | 60.4 | 0.50 |
| 250 | 5.33 | 0.58 | 5.00 | 60.4 | 0.50 |

The first column in Table 1 shows the full scale primary current. The second column shows the nominal burden resistor $R_B$ needed on a 4000 turn secondary current transformer to produce a 0.333 volt output $E_B$. The third column shows the initial phase error (i.e., the phase angle error with no phase compensation or correction with capacitance). The fourth column shows the capacitance needed to reduce this initial phase error to zero. The sixth column shows the phase compensation resistance $R_{pc}$ added to allow a reduced phase compensation capacitance listed in column seven.

As can be seen in Table 1, the lower amperage current transformers need less phase compensation resistance $R_{pc}$, which is due to the high value of burden resistance $R_B$ of the lower amperage units relative to the higher amperage units. Since the burden resistor $R_B$ decreases with increasing full scale current, adding a phase compensating boost resistor $R_{pc}$ significantly lowers the capacitance value required for the phase compensation capacitor $C_{pc}$. For the 250 amp current transformer, the phase compensation required is reduced by a factor of ten.

Figure 6:
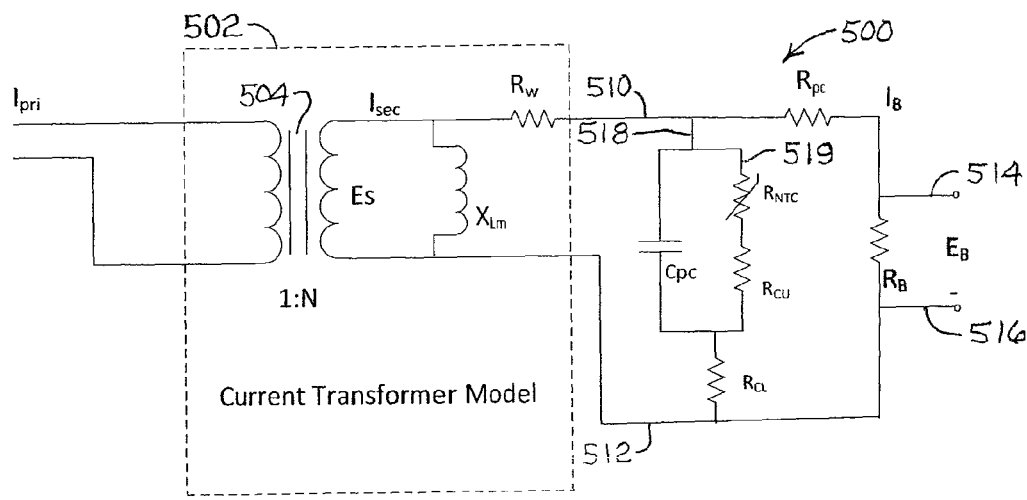
FIG. 6 is a schematic diagram of an example current transformer circuit with temperature compensation.

There are limitations on how much phase resistance can be added. The Table 1 above shows results for 0.333 volt output $E_B$ models. Other models may be designed and provided to meet the international standard IEC60044-8 (International Electrotechnical Commission, Geneva, Switzerland), which allows a 22.5 millivolts output $E_B$. At lower output voltages $E_B$, a smaller burden resistance $R_B$ is required. Table 2 below shows in column four the phase compensation capacitance $C_{pc}$ values required for three example available models of 0.0225 volt output $E_B$ current transformers. A 1.64 uF capacitor $C_{pc}$ is required for the 5 amp model, and a 74.2 uF capacitor $C_{pc}$ is required for the 250 amp current transformer. Column seven shows that these capacitance values for the phase compensation capacitor $C_{pc}$ can be reduced down to 0.5 μF and 2.67 μF, respectively, using the respective boost resistances $R_B$ shown in column six. An increasing $R_{pc}$ value reduces margin to saturation (see equation 10 above) and increases power consumption. The 250 amp current transformer of Table 2 could have used a 0.6 μF capacitor with a boost resistance of 56 ohms, but the margin to saturation with that combination of values was not satisfactory for the particular application, so a larger capacitor was chosen in this case. A small value of $R_{pc}$ requires a larger phase compensation capacitance. Capacitive phase compensation above five microfarads becomes expensive and would require more space, which would make the current transformer larger. Equation 9 and Equation 10 are used to optimize the $R_{pc}$ and $C_{pc}$ values. Since resistors have finer values it is easier to select a capacitance, such as 0.5 uF in Table 1, and then select the closest available boost resistance $R_B$ to get a phase angle correction to zero or near zero degrees, or to any other desired phase angle.

in the shunt circuit branch 418 between the output leads 410, 412, and in parallel to the burden resistor $R_B$ and the boost resistor $R_{pc}$. The optional shunt resistor $R_S$ reduces the amplitude variation of the output voltage $E_B$ over frequency caused by the capacitor $C_{pc}$, could be placed on either or both sides of the shunt capacitor $C_{pc}$ in the shunt circuit branch 418. If such shunt resistance $R_S$ is used, the capacitance value of the shunt capacitor $C_{pc}$ would have to be greater than if shunt resistance $R_S$ is not used in order to achieve a desired phase angle error correction, but the resulting expanded frequency range in which effective phase angle error correction can be achieved may be worth the tradeoff for some applications. As mentioned above, the capacitive shunt impedance $X_{Cpc}$ can be provided in other ways. An alternative method and example circuit 500 for phase angle error correction with temperature compensation is shown in FIG. 6. The inductance $L_m$ of the ferrite core 504 changes with temperatures, so the amplitude of the output of the current transformer (model circuit 502) as well as the phase angle error varies with temperature. To minimize the output phase angle error variation of the current transformer (model circuit 502) as the temperature varies, the amount of capacitive phase compensation must vary. For ferrite cores, the inductance typically decreases with temperature in a nonlinear fashion. At lower temperatures the core inductive impedance decreases, causing greater magnetizing current. To compensate, the currents through the capacitor $C_{pc}$ must increase. Such increase can be provided, for example, by placing a resistor with a negative temperature coefficient ($R_{NTC}$) in parallel with the shunt capacitor $C_{pc}$, as illustrated in FIG. 6. Then, as the temperature decreases, the resistance $R_{NTC}$ increases, thereby allowing more current to flow through the shunt capacitor $C_{pc}$. By choosing a network of components, for example, those shown in the temperature compensating, phase angle error correction shunt circuit branch 518 illustrated in FIG. 6 and described below, the effective capacitance compensation for phase angle correction can vary with temperature to match or approximate the nonlinear changes in the inductance of the core. In the example capacitance phase angle error compensating circuit 500 shown in FIG. 6, a negative temperature coefficient thermistor $R_{NTC}$ is positioned in a temperature compensating, phase angle error correction shunt circuit branch 518 in parallel with the shunt capacitor $C_{pc}$, which is also in the shunt circuit branch 518. The thermistor $R_{NTC}$ has less resistance at

TABLE 2

Phase Compensation for 22.5 mV Current Transformers

| CT Full Scale Current, Amps | Burden Resistor, $R_B$, ohms | Phase Error, Degrees | Initial Phase Capacitance ($C_{pc}$) required to correct phase error to zero degrees, microfarads | Added Phase Compensation Resistor, $R_{pc}$, ohms | Phase Capacitance ($C_{pc}$) required to correct phase error after adding $R_{pc}$, microfarads |
|---|---|---|---|---|---|
| 5 | 17.25 | 0.61 | 1.64 | 56 | 0.5 |
| 50 | 1.72 | 0.56 | 15 | 56 | 0.6 |
| 250 | 0.34 | 0.55 | 74.2 | 10 | 2.67 |

Figure 5:
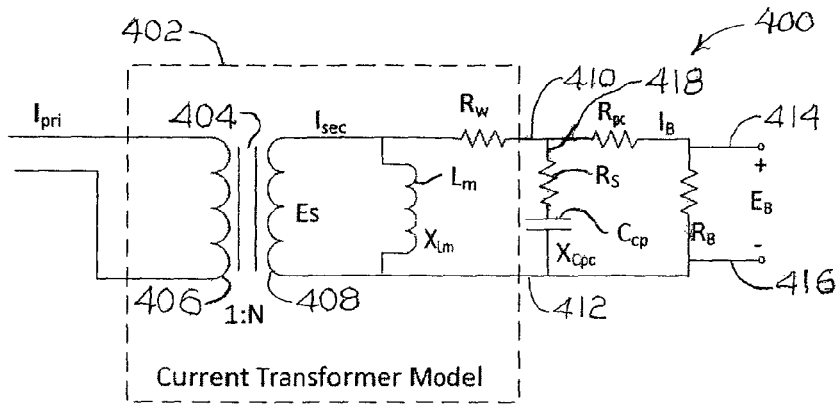
FIG. 5 is a schematic diagram of a simplified equivalent circuit model and example resistor-boosted phase correction subcircuit similar to FIG. 4, but with an added shunt resistor in series with the capacitance for decreasing sensitivity of the circuit to frequency.

As explained above, the phase angle correction provided by the combination shunt capacitor $C_{pc}$ and parallel boost resistor $R_{pc}$ is sensitive to frequency, so the particular capacitance value for the shunt capacitor $C_{pc}$ and the resistance or impedance value of the boost resistor $R_{pc}$ have to be selected to provide the phase angle error correction desired for a particular frequency. To lessen such frequency dependence or sensitivity, an optional shunt resistor $R_S$ shown, for example, in FIG. 5, can be placed in series with the shunt capacitor $C_{pc}$ in the shunt circuit branch 418 between the output leads 410, high temperatures than at low temperatures. The shunt circuit branch 518 is connected between the current transformer (model circuit 502) output leads 510, 512, in parallel to the burden resistor $R_B$ and the boost resistor $R_{pc}$, similar to the shunt circuit branch 418, burden resistor $R_B$, and boost resistor $R_{pc}$ as explained above for the example circuit in FIG. 4. As in the FIG. 4 example, the boost resistor $R_{pc}$ in the FIG. 6 example circuit 500 is in series with the resistor $R_B$, both of which are in parallel to the shunt branch circuit 518.

The shunt branch circuit 518 connected between the current transformer 502 outlet leads 510, 512 comprises the shunt capacitor $C_{pc}$ in parallel with a sub-branch circuit 519, which comprises the thermistor $R_{NTC}$ in series with an optional compensation upper resistor $R_{cu}$. An optional compensation lower resistor $R_{CL}$ is positioned in series with both the capacitor $C_{pc}$ and the sub-branch circuit 519. At higher temperatures, the resistance of the thermistor $R_{NTC}$ decreases, thus shunting more and more current around the capacitor $C_{pc}$ and making the shunt branch circuit 518 less and less capacitive. Such decreasing capacitance of the shunt branch circuit 518 with increasing temperature causes the capacitive compensation/correction of the phase angle error to decrease as the current transformer reactance $X_{Lm}$ increases with the increasing temperature. On the other hand, as the temperature gets colder, the resistance of the thermistor $R_{NTC}$ increases, causing more of the current to flow through the shunt capacitor $C_{pc}$, which causes the shunt circuit branch 518 to become more capacitive. Such increasing capacitance of the shunt branch circuit 518 with decreasing temperature causes the capacitive compensation/correction of the phase angle error to increase as the current transformer reactance $X_{Lm}$ decreases with the decreasing temperature. The thermistor $R_{NTC}$ could approach a short circuit, i.e., little resistance, at very high temperatures, depending on the inherent characteristics of the particular thermistor $R_{NTC}$ used, so the optional compensation upper resistor $R_{CU}$ in series with the thermistor $R_{NTC}$ can prevent such a short circuit around the capacitance $C_{pc}$. Also, the compensation upper resistor $R_{CU}$ can bias the resistance versus temperature curve of the thermistor $R_{NTC}$ to provide the sub-branch 519 with the resistance values needed for the capacitance $C_{pc}$ to provide effective phase angle error correction that matches or approximates the changing phase angle error from the changing inductance $X_{Lm}$ of the core as temperature changes.

The change in the core inductance $X_{Lm}$ over temperature may be nonlinear and can be compensated for phase angle correction by selecting appropriate values of $R_{NTC}$, $R_{CU}$, and $R_{CL}$ for a particular $C_{pc}$ and $R_{pc}$ phase angle correction combination.

The optional shunt compensation lower resistor $R_{CL}$ can be placed in the shunt branch circuit 518 in series with the shunt capacitor $C_{pc}$, as shown in FIG. 6, to reduce the frequency sensitivity of the capacitor and of the phase and amplitude of the output voltage $E_B$, so that a particular combination of $C_{pc}$, $R_{pc}$, $R_{NTC}$, $R_{CU}$, and $R_{CL}$ can provide effective phase angle correction and temperature compensation over a wider frequency range, which might be beneficial for some applications. The shunt compensation lower resistor $R_{CL}$ also reduces the amplitude variation of the output voltage $E_B$ as a function of temperature. The goal, as explained above, is to provide output voltage $E_B$ measurements across the burden resistor $R_B$ (e.g., between output leads 514, 516 in FIG. 5) with minimal or no phase angle error with respect to the input or primary current $I_{pri}$.

The core inductance variation causes not only the phase angle to vary but also the output signal amplitude. Such output amplitude variation caused by temperature is called ratio error. Since the inductance of the core varies with temperature, the magnetizing current will change, which in turn effects the current flowing through the burden resistor, changing the output signal amplitude. At colder temperatures the core reactive impedance typically decreases resulting in greater magnetizing current. For a fixed primary current, supplying more magnetizing current results in less current flowing to the output (through the burden resistor). At warmer temperatures the magnetizing inductive impedance increases and results in less magnetizing current. This relationship over temperature can be nonlinear. The amplitude error, also known as ratio error, can be corrected or minimized by the resistances $R_{NTC}$, $R_{UL}$, and $R_{CL}$ shown in FIG. 6 and described above, regardless of whether they are used with or without the capacitor $C_{pc}$ in the branch circuit 518. In other words, if only ratio error, not phase angle error, caused by temperature variations is to be corrected, then the capacitor $C_{pc}$ can be eliminated from the branch circuit 518, which leaves the resistances $R_{NTC}$, $R_{UL}$, and $R_{CL}$ in series with each other in the branch circuit 518. At colder temperatures the magnetizing current increases while the current through the $R_{NTC}$, $R_{UL}$, and $R_{CL}$ branch 518 will decrease since the thermistor $R_{NTC}$ resistance increases. The opposite is true at higher temperatures. If $R_{NTC}$, $R_{UL}$, and $R_{CL}$ are used to optimize phase error compensation as described above, it may be challenging to accomplish both amplitude ratio error and phase angle error compensation simultaneously to a sufficient extent. If so, an additional resistor/thermistor combination could be placed across the output on either side of $R_{pc}$ to provide the amplitude compensation separate from the phase compensation.

The foregoing description is considered as illustrative of the principles of the invention. Furthermore, since numerous modifications and changes will readily occur to those skilled in the art, it is not desired to limit the invention to the exact construction and process shown and described above. Accordingly, resort may be made to all suitable modifications and equivalents that fall within the scope of the invention. The words "comprise," "comprises," "comprising," "include," "including," and "includes" when used in this specification are intended to specify the presence of stated features, integers, components, or steps, but they do not preclude the presence or addition of one or more other features, integers, components, steps, or groups thereof.

The embodiments of the invention in which an exclusive property or privilege is claimed are defined as follows:

1. Current transformer apparatus for producing an output signal on a secondary circuit that is proportional to AC current flowing in a primary electrical conductor, comprising:
   a magnetic core that is capable of conducting magnetic flux induced by an AC primary current flowing in an electrical conductor;
   a secondary circuit with first and second output leads and comprising a secondary winding of electrically conductive wire wound around at least a portion of the core and in which secondary electric current is induced by magnetic flux in the core;
   a burden resistance positioned between the first and second output leads to create an output voltage signal on the first and second output leads;
   a capacitive shunt circuit across the burden resistance; and
   an isolating impedance between the burden resistance and the capacitive shunt circuit that increases voltage across the capacitive shunt circuit to a value that is higher than the output voltage signal.

2. The current transformer apparatus of claim 1, wherein the isolating impedance includes a boost resistance positioned in series with the burden resistance and in parallel with the capacitive shunt circuit.

3. The current transformer apparatus of claim 2, wherein the shunt capacitance circuit has a capacitance value that is greater than zero and not greater than five microfarads, and wherein the boost resistance has a resistance value that is sufficient to cause enough of the secondary current to flow as a shunt current through the shunt capacitance circuit to correct an uncorrected phase angle error in a range of 0.3 to 5.0 degrees between the AC primary current and the output signal to a corrected phase angle error that does not exceed 0.2 degrees.

4. The current transformer apparatus of claim 3, wherein the boost resistance value is:

$$R_{pc} = \frac{R_w}{\omega^2 L_m C_{pc} - 1} - R_B$$

where:
- $R_{pc}$ is the boost resistance value (ohms);
- $R_B$ is the burden resistance value (ohms);
- $R_w$ is the resistance of the secondary winding (ohms);
- $L_m$ is the inductance of current transformer (H);
- $C_{pc}$ is the capacitance value of the shunt capacitance circuit (F); and
- $\omega$ is the radian frequency of the secondary current (radians/second).

5. The current transformer apparatus of claim 4, wherein the boost resistance value is such that the secondary winding voltage $E_S$ according to the relationship:

$$E_s = I_{sec} * \frac{j\omega L_m\left(R_w + \frac{R_B + R_{pc}}{1 + j\omega C_{pc}(R_B + R_{pc})}\right)}{j\omega L_m + R_w + \frac{R_B + R_{pc}}{1 + j\omega C(R_B + R_{pc})}}$$

is not greater than the voltage $E/\sqrt{2}$ of the secondary winding as determined by:

$$E = 2\pi f N A_c B$$

where $I_{sec}$ is the secondary current in the secondary winding, E is the peak voltage of the secondary winding, f is the frequency in hertz, N is the number of secondary turns, $A_c$ is the cross-sectional area of the core in square meters, and B is the peak magnetic flux density in tesla with a value that is below the saturation level of the core.

6. The current transformer apparatus of claim 5, wherein the capacitance value is provided by a C0G (NP0) ceramic capacitor.

7. The current transformer apparatus of claim 5, wherein the boost resistance is greater than the burden resistance.

8. The current transformer apparatus of claim 2, wherein the boost resistance is greater than the burden resistance.

9. The current transformer apparatus of claim 1, including a variable resistance in the capacitive shunt circuit that varies as a function of temperature in a manner that decreases current flow through the capacitance as temperature increases and that increases current flow through the capacitance as temperature decreases to provide temperature compensation in the capacitive phase angle correction for changes in phase angle error as a function of temperature.

10. The current transformer apparatus of claim 9, wherein the variable resistance includes a resistor with a negative temperature coefficient across the capacitance in the capacitive shunt circuit.

11. The current transformer apparatus of claim 1, wherein the shunt capacitance circuit has a capacitance value that is greater than zero and not greater than five microfarads, and wherein the isolating impedance is sufficient to cause enough of the secondary current to flow as a shunt current through the shunt capacitance circuit to correct an uncorrected phase angle error in a range of 0.3 to 5.0 degrees between the AC primary current and the output signal to a corrected phase angle error that does not exceed 0.2 degrees.

12. The current transformer apparatus of claim 11, wherein the capacitance value is provided by a C0G (NP0) ceramic capacitor.

13. Current transformer apparatus for producing an output signal on a secondary circuit that is proportional to AC current flowing in a primary electrical conductor, comprising:
- a magnetic core that is capable of conducting magnetic flux induced by an AC primary current flowing in an electrical conductor;
- a secondary circuit with first and second output leads and comprising a secondary winding of electrically conductive wire wound around at least a portion of the core and in which secondary electric current is induced by magnetic flux in the core;
- a capacitive shunt circuit across the output leads; and
- an isolating impedance between the output signal on the output leads and the capacitive shunt circuit that increases voltage across the capacitive shunt circuit.

14. The current transformer apparatus of claim 13, wherein the isolating impedance includes a boost resistance.

15. The current transformer apparatus of claim 1, wherein the shunt capacitance circuit includes a C0G (NP0) capacitor with a capacitance value that is greater than zero and not greater than five microfarads, and wherein the isolating impedance is sufficient to cause enough of the secondary current to flow as a shunt current through the shunt capacitance circuit to correct an uncorrected phase angle error in a range of 0.3 to 5.0 degrees between the AC primary current and the output signal to a corrected phase angle error that does not exceed 0.2 degrees.

16. A method of providing phase angle error correction in a current transformer which has a magnetic core and a secondary winding for producing a secondary current in a secondary circuit that is proportional to a primary current in a primary conductor and that includes a pair of opposite polarity output leads and a burden resistance across the secondary winding and the output leads to provide an output voltage signal on the output leads that is proportional to the primary current in the primary conductor; comprising:
- providing a shunt capacitance circuit across the burden resistance to shunt a portion of the secondary current to flow through the shunt capacitance circuit to produce a capacitive phase angle correction for an inductive phase angle error in the current transformer; and
- providing isolating impedance between the burden resistance and the shunt capacitance to increase the shunt current flow through the shunt capacitance to boost the capacitive phase angle correction.

17. The method of claim 16, including providing the isolating impedance by providing a boost resistance in series with the burden resistance and in parallel with the shunt capacitance circuit.

18. The method of claim 17, including correcting an uncorrected phase angle error in a range of 0.3 to 5.0 degrees between the primary current and the output voltage signal to a corrected phase angle error that does not exceed 0.2 degrees by:
- providing the shunt capacitance circuit with a capacitance value that is greater than zero and not greater than five microfarads; and
- providing the boost resistance with a resistance value that is sufficient to cause enough shunt current flow through the shunt capacitance circuit to attain the corrected phase angle error in the range of zero to 0.2 degrees.

19. The method of claim 18, including providing the boost resistance value as:

$$R_{pc} = \frac{R_w}{\omega^2 L_m C_{pc} - 1} - R_B$$

where:
R$_{pc}$ is the boost resistance value (ohms);
R$_B$ is the burden resistance value (ohms);
R$_w$ is the inherent resistance of the secondary winding (ohms);
L$_m$ is the inductance of current transformer (H);
C$_{pc}$ is the capacitance value of the shunt capacitance circuit (F); and
ω is the radian frequency of the secondary current (radians/second).

20. The method of claim 19, including providing the boost resistance value such that the secondary winding voltage E$_S$ according to the relationship:

$$E_s = I_{sec} * \frac{j\omega L_m * \left(R_w + \frac{R_B + R_{pc}}{1 + j\omega C_{pc}(R_B + R_{pc})}\right)}{j\omega L_m + R_w + \frac{R_B + R_{pc}}{1 + j\omega C_{pc}(R_B + R_{pc})}}$$

is not greater than the voltage E/√2 of the secondary winding as determined by:

$$E = 2\pi f N A_c B$$

where I$_{sec}$ is the secondary current in the secondary winding, E is the peak voltage of the secondary winding, f is the frequency in hertz, N is the number of secondary turns, A$_c$ is the cross-sectional area of the core in square meters, and B is the peak magnetic flux density in tesla with a value that is below the saturation level.

21. The method of claim 20, including providing the capacitance value for the shunt capacitance circuit with a C0G (NP0) capacitor that has a capacitance value which is greater than zero and not greater than five microfarads.

22. The method of claim 20, wherein the boost resistance is greater than the burden resistance.

23. The method of claim 17, wherein the boost resistance is greater than the burden resistance.

24. The method of claim 17, including providing temperature compensation in the capacitive phase angle correction for non-linear changes in inductive phase angle error as a function of temperature by varying the current through the shunt capacitance as a function of temperature.

25. The method of claim 24, including varying the current through the shunt capacitance as a function of temperature by providing a resistor in which resistance varies as a function of temperature in parallel to the shunt capacitance to enable: (i) increased current flow around the shunt capacitance as temperature increases, thus causing decrease in current flow through the shunt capacitance which decreases the capacitive phase angle error correction; and (ii) decreased current flow around the shunt capacitance as temperature decreases, thus causing increase in current flow through the shunt capacitance which increases the capacitive phase angle error correction.

26. The method of claim 16, including correcting an uncorrected phase angle error in a range of 0.3 to 5.0 degrees between the primary current and the output voltage signal to a corrected phase angle error that does not exceed 0.2 degrees by:
providing the shunt capacitance circuit with a capacitance value that is greater than zero and not greater than five microfarads; and
providing enough of the isolating impedance to cause enough shunt current flow through the shunt capacitance circuit to attain the corrected phase angle error in the range of zero to 0.2 degrees.

27. A method of providing phase angle error correction in a current transformer which has a magnetic core and a secondary winding for producing an output signal on a pair of opposite polarity output leads that is proportional to a primary current in a primary conductor; comprising:
providing a shunt capacitance circuit across the output leads to shunt a portion of a secondary current induced in the secondary winding to flow through the shunt capacitance circuit to produce a capacitive phase angle correction for an inductive phase angle error in the current transformer; and
providing a boost resistance in parallel with the shunt capacitance circuit and in series with the output leads in a manner that increases the shunt current flow through the shunt capacitance circuit to boost the capacitive phase angle correction.

28. The method of claim 27, including correcting an uncorrected phase angle error in a range of 0.3 to 5.0 degrees between the primary current and the output signal to a corrected phase angle error that does not exceed 0.2 degrees by:
providing the shunt capacitance circuit with a capacitance value that is greater than zero and not greater than five microfarads; and
providing the boost resistance with a resistance value that is sufficient to cause enough shunt current flow through the shunt capacitance circuit to attain the corrected phase angle error in the range of zero to 0.2 degrees.

29. The method of claim 28, including:
providing a burden resistance across the output leads in parallel with the shunt capacitance circuit to provide an output voltage across the output leads; and
providing the boost resistance value as:

$$R_{pc} = \frac{R_w}{\omega^2 L_m C_{pc} - 1} - R_B$$

where:
R$_{pc}$ is the boost resistance value (ohms);
R$_B$ is the burden resistance value (ohms);
R$_w$ is the inherent resistance of the secondary winding (ohms);
L$_m$ is the inductance of current transformer (H);
C$_{pc}$ is the capacitance value of the shunt capacitance circuit (F); and
ω is the radian frequency of the secondary current (radians/second).

30. The method of claim 29, including providing the boost resistance value such that the secondary winding voltage E$_S$ leads according to the relationship:

$$E_s = I_{sec} * \frac{j\omega L_m * \left(R_w + \frac{R_B + R_{pc}}{1 + j\omega C_{pc}(R_B + R_{pc})}\right)}{j\omega L_m + R_w + \frac{R_B + R_{pc}}{1 + j\omega C_{pc}(R_B + R_{pc})}}$$

is not greater than the voltage $E/\sqrt{2}$ of the secondary winding as determined by:

$$E = 2\pi f N A_c B$$

where $I_{sec}$ is the secondary current in the secondary winding, E is the peak voltage of the secondary winding, f is the frequency in hertz, N is the number of secondary turns, $A_c$ is the cross-sectional area of the core in square meters, and B is the peak magnetic flux density in tesla with a value that is below the saturation level.

31. The method of claim 29, including providing the capacitance value for the shunt capacitance circuit with a C0G (NP0) capacitor that has a capacitance value which is greater than zero and not greater than five microfarads.

32. The method of claim 18, wherein the boost resistance is greater than the burden resistance.

33. Current transformer apparatus for producing an output signal on a secondary circuit that is proportional to AC current flowing in a primary electrical conductor, comprising:
  a magnetic core that is capable of conducting magnetic flux induced by an AC primary current flowing in an electrical conductor;
  a secondary circuit with first and second output leads and comprising a secondary winding of electrically conductive wire wound around at least a portion of the core and in which secondary electric current is induced by magnetic flux in the core; and
  a variable resistance in a shunt circuit that varies as a function of temperature in a manner that decreases current through the shunt circuit as temperature decreases and that increases current through the shunt circuit as temperature increases to provide temperature compensation to amplitude of the output signal.

34. The current transformer apparatus of claim 33, wherein the variable resistance includes a resistor with a negative temperature coefficient.

* * * * *